US011302571B2

(12) United States Patent
Ghosh et al.

(10) Patent No.: US 11,302,571 B2
(45) Date of Patent: Apr. 12, 2022

(54) CUT INTEGRATION FOR SUBTRACTIVE FIRST METAL LINE WITH BOTTOM UP SECOND METAL LINE

(71) Applicant: International Business Machines Corporation, Armonk, NY (US)

(72) Inventors: Somnath Ghosh, Clifton Park, NY (US); Hsueh-Chung Chen, Cohoes, NY (US); Yongan Xu, Jr., San Jose, CA (US); Yann Mignot, Slingerlands, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 16/598,058

(22) Filed: Oct. 10, 2019

(65) Prior Publication Data

US 2021/0111066 A1 Apr. 15, 2021

(51) Int. Cl.
*H01L 21/768* (2006.01)
*H01L 23/532* (2006.01)
*H01L 21/311* (2006.01)

(52) U.S. Cl.
CPC .. *H01L 21/76802* (2013.01); *H01L 21/31144* (2013.01); *H01L 21/76832* (2013.01); *H01L 21/76846* (2013.01); *H01L 21/76897* (2013.01); *H01L 23/53238* (2013.01)

(58) Field of Classification Search
CPC ......... H01L 21/76802; H01L 21/76897; H01L 21/31144; H01L 21/76846; H01L 21/76832; H01L 23/53238
See application file for complete search history.

(56) References Cited

U.S. PATENT DOCUMENTS

| 8,987,142 | B2 | 3/2015 | Lee et al. |
| 8,992,792 | B2 | 3/2015 | Chang et al. |
| 9,368,349 | B2 | 6/2016 | Huang et al. |
| 9,472,414 | B2 | 10/2016 | Yang et al. |
| 9,911,604 | B1 | 3/2018 | Sun et al. |

(Continued)

OTHER PUBLICATIONS

Z. Wu et al., "Pathfinding of Ru-Liner/Cu-Reflow Interconnect Reliability Solution," IEEE International Interconnect Technology Conference (IITC), Jun. 4-7, 2018, pp. 51-53.

(Continued)

*Primary Examiner* — Kyoung Lee
*Assistant Examiner* — Christina A Sylvia
(74) *Attorney, Agent, or Firm* — Randall Bluestone; Ryan, Mason & Lewis, LLP

(57) ABSTRACT

A method includes applying a first metallic layer having a first metallic material onto a substrate of a semiconductor component. The method further includes removing portions of the first metallic layer to form a first metallic line. The method further includes creating an opening in the first metallic line. The method also includes depositing a dielectric material on the substrate. The method further includes forming at least one trench in the dielectric material. The method also includes depositing a second metallic material within the at least one trench to form a second metallic line. At least the first and second metallic lines and the dielectric material form an interconnect structure of the semiconductor component.

20 Claims, 12 Drawing Sheets

(56) References Cited

U.S. PATENT DOCUMENTS

| | | | |
|---|---|---|---|
| 10,020,224 B2 | 7/2018 | Anderson et al. | |
| 10,157,789 B2 | 12/2018 | Chen et al. | |
| 2012/0161320 A1 | 6/2012 | Akolkar et al. | |
| 2014/0264930 A1* | 9/2014 | Yu | H01L 24/13 257/774 |
| 2016/0027864 A1* | 1/2016 | Yang | H01L 23/5223 257/532 |
| 2016/0365277 A1* | 12/2016 | Fang | H01L 21/7684 |
| 2019/0384180 A1* | 12/2019 | Briggs | H01L 21/0337 |
| 2020/0388567 A1* | 12/2020 | Mignot | H01L 21/31144 |
| 2020/0388597 A1* | 12/2020 | Chaji | H01L 33/60 |

OTHER PUBLICATIONS

S. Paolillo et al., "Direct Metal Etch of Ruthenium for Advanced Interconnect," Journal of Vacuum Science & Technology B, Apr. 2018, 9 pages, vol. 36, No. 3.

M. Nakahara et al., "Etching Technique for Ruthenium with a High Etch Rate and High Selectivity Using Ozone Gas," Journal of Vacuum Science & Technology B, Sep. 2001, pp. 2133-2136, vol. 19, No. 6.

* cited by examiner

CUT INTEGRATION FOR SUBTRACTIVE FIRST METAL LINE WITH BOTTOM UP SECOND METAL LINE

BACKGROUND

The present disclosure relates to semiconductor fabrication techniques and, in particular, relates to a methodology for forming a metallic pattern for a back-end-of-line (BEOL) interconnect structure.

A semiconductor integrated circuit chip is typically fabricated with a BEOL interconnect structure, which comprises multiple levels of metal lines and inter-level metal vias, to connect various integrated circuit components and devices that are fabricated as part of a front-end-of-line (FEOL)/middle-of-line (MOL) layer(s) of the semiconductor integrated circuit chip. Multiple patterning processes such as self-aligned multiple patterning (SAMP), self-aligned double patterning (SADP), self-aligned quadruple patterning (SAQP) and self-aligned triple patterning (SATP) are typically incorporated as part of the BEOL process for advanced design parameters and to address aggressive pitch requirements. However, patterning with these technologies is limited due to the unidirectional approach required by these schemes and issues involving segment removal of portions of the patterning where metal lines are not needed. Moreover, segment removal processes associated with these schemes are tedious and time-consuming, and may potentially have a deleterious effect on the functioning of the interconnect structure.

SUMMARY

Embodiments of the present application provide techniques for fabricating metallic lines in a BEOL interconnect structure as a component of a semiconductor device. In one illustrative embodiment, a method comprises applying a first metallic layer comprising a first metallic material onto a substrate of a semiconductor component. The method further comprises removing portions of the first metallic layer to form a first metallic line. The method further comprises creating an opening in the first metallic line. The method also comprises depositing a dielectric material on the substrate. The method further comprises forming at least one trench in the dielectric material. The method also comprises depositing a second metallic material within the at least one trench to form a second metallic line. At least the first and second metallic lines and the dielectric material form an interconnect structure of the semiconductor component.

In another illustrative embodiment, a method comprises depositing one lithographic stack onto a dielectric material of a semiconductor substrate. The one lithographic stack includes a patterned photoresist, a hardmask liner below the patterned photoresist and a sacrificial material beneath the hardmask liner. The method further comprises etching the hardmask liner and the sacrificial material in accordance with the patterned photoresist to form a cavity at least in the hardmask liner and the sacrificial material and extending to the dielectric material. The method further comprises depositing an additional lithographic stack on the one lithographic stack. The additional lithographic stack includes a patterned photoresist, a hardmask liner below the patterned photoresist and a sacrificial material beneath the hardmask liner. The sacrificial material of the additional lithographic stack at least partially fills the cavity. The method further comprises etching the additional lithographic stack in accordance with the patterned photoresist of the additional lithographic stack to define a pillar extending from the one lithographic stack in alignment with the cavity. The method further comprises removing portions of the sacrificial material of at least the additional lithographic stack within the cavity and around the pillar to define openings extending to the dielectric material, forming trenches in the dielectric material and depositing a metallic material within the trenches to form a metallic line in the dielectric material. The metallic line includes an opening filled with a segment of dielectric material.

In another illustrative embodiment, a method comprises forming a first metallic line on a substrate of a semiconductor component, removing a segment of the first metallic line to define an opening therein and depositing a dielectric material on the substrate. The dielectric material fills the opening within the first metallic line. The method further comprises patterning, with a lithographic process, an image of a cavity on the dielectric material, disposing at least one lithographic stack relative to the substrate, etching the at least one lithographic stack to form a lithographic pillar in alignment with the cavity, removing dielectric material on each side of the lithographic pillar in accordance with the image of the cavity to form two aligned trenches in the dielectric material, removing the lithographic pillar, and depositing a second metallic material within the two aligned trenches to form a second metallic line having an opening filled with the dielectric material.

Other embodiments will be described in the following detailed description of embodiments, which is to be read in conjunction with the accompanying figures.

DETAILED DESCRIPTION

Figure 2:
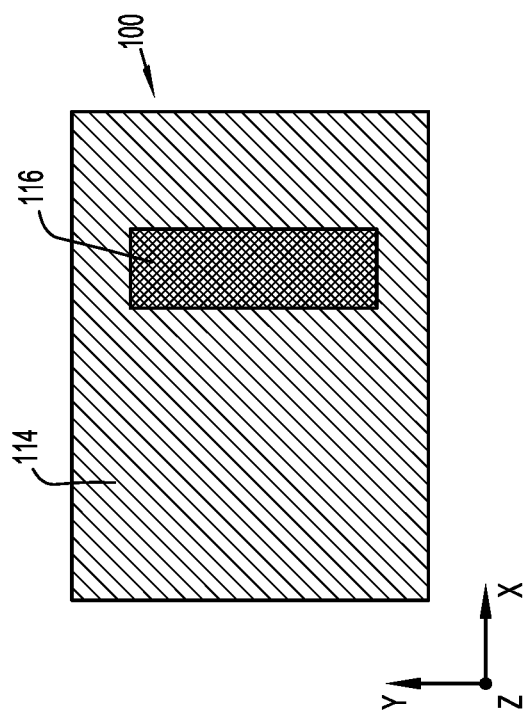
FIG. 2 is a schematic top plan view of the semiconductor structure at the first intermediate stage of fabrication according to one or more illustrative embodiments.

Embodiments will now be described in further detail with regard to semiconductor devices including BEOL interconnect structures with metal patterning, as well as methods for fabricating metal patterning in a BEOL structure where the patterning is achieved through a double patterning lithographic etch processes, otherwise known as a litho/etch litho/etch process (hereinafter, referred to as "LELE"). The disclosed methodology is used in conjunction with a subtractive etch process to form a cut in at least one line of the metal patterning and a simplified self-aligned cut process, e.g., a damascene process, to form a cut in at least one second line of the metal patterning of the BEOL structure. The methodologies disclosed herein remove the need for additional segment removal processes and the disadvantages associated therewith discussed hereinabove. Moreover, the processes described herein address critical dimension (CD) issues associated with the current scaling down of integrated circuits.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Methods for fabricating a semiconductor structure incorporating a BEOL interconnect with metal patterning will now be discussed in further detail with reference to FIGS. 1 through 20, which schematically illustrate a semiconductor structure 100 at various intermediate stages of fabrication. The term semiconductor structure 100 used herein may include a semiconductor or integrated circuit at any point in processing or fabrication of the semiconductor structure 100. In addition, the following discussion will identify various stages of fabrication of the semiconductor structure 100. It is to be understood that the intermediate stages are exemplative only. More or less intermediate stages may be implemented in processing the semiconductor structure, and the disclosed stages may be in different orders or sequences. In addition, one or more processes may be incorporated within various intermediate stages as described herein, and one or more processes may be implemented in intermediate stages as otherwise described herein.

Figure 1:
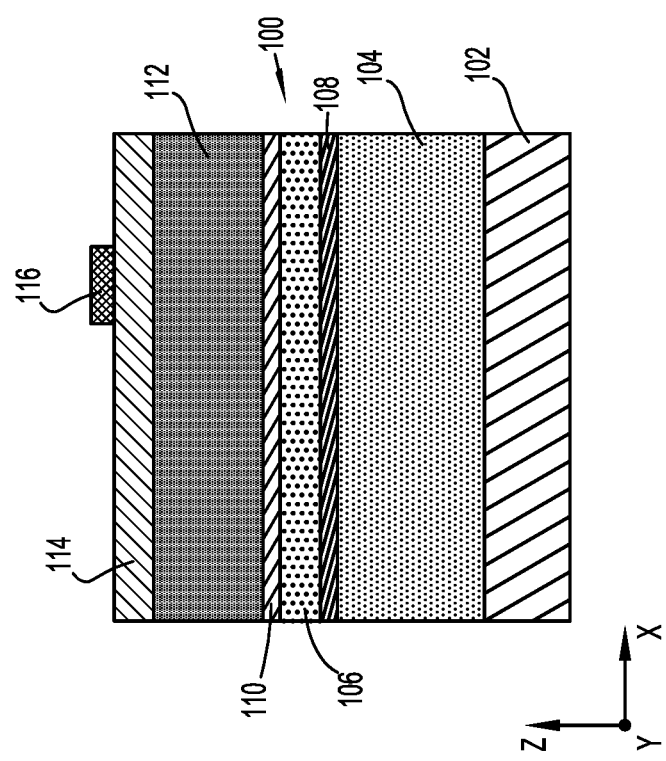
FIG. 1 is a schematic cross-sectional view along the x-axis of a semiconductor structure at a first intermediate stage of fabrication illustrating a semiconductor substrate and an interconnect structure disposed on the semiconductor substrate according to one or more illustrative embodiments.

BEOL fabrication occurs subsequent to middle of line (MOL) and front-end of line (FEOL) processing of the semiconductor structure. The MOL and FEOL processes are not shown for simplicity. To begin, FIG. 1 is a schematic cross-sectional side view of a semiconductor structure 100 at a first intermediate stage of fabrication comprising a semiconductor substrate 102 and a plurality of layers or materials disposed on the semiconductor substrate 102. The layers will be processed in accordance with the methodologies described herein to provide an interconnect structure, e.g., a BEOL interconnect structure, for incorporation within the semiconductor structure 100.

In general, the semiconductor substrate 102, at this stage in the fabrication process, includes one or more layers such as, for example, a semiconductor wafer substrate layer, a FEOL layer formed on the semiconductor wafer substrate, and a MOL layer formed on the FEOL layer. The semiconductor substrate 102 may comprise one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g. III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of the BEOL interconnect that is formed over the FEOL/MOL layers.

With continued reference to FIG. 1, an interlayer dielectric substrate 104 is disposed on the semiconductor substrate 102, which may include one or more layers of various materials. In one exemplative embodiment, the interlayer dielectric substrate 104 comprises a "low k" insulating/dielectric material such as octamethylcyclotetrasiloxane (OMCTS). The interlayer dielectric substrate 104 may, in the alternative, include a layer of silicon oxide (e.g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), SiOC films or SiOCH low-k films and other similar types of insulating/dielectric materials or porous dielectrics which are non-reactive with the metallic material that is used to form metallic interconnect structures in the BEOL interconnect structure. The interlayer dielectric substrate 104, in an embodiment, is designed to minimize capacitive coupling, and has a dielectric constant of 3.0 or less. In one exemplary embodiment, the interlayer dielectric substrate 104 is formed of OMCTS and has a thickness in a range of about 20 nm to about 800 nm. The interlayer dielectric substrate 104 is formed using known deposition techniques, such as, for example, ALD (atomic layer deposition), CVD (chemical vapor deposition) PECVD (plasma-enhanced CVD), or PVD (physical vapor deposition), or spin-on deposition.

On top of the interlayer dielectric substrate 104 is a metallic layer 106 of, for example, ruthenium, which will be the material forming the first metallic line of the BEOL interconnect structure. Other metals for the metallic layer 106 are also envisioned including, e.g., copper, cobalt, titanium, copper, aluminum, tungsten, or iridium, or alloys thereof. The metallic layer 106 of ruthenium may be applied via a blanket deposition process and subsequently planarized. Known dry deposition techniques such as ALD, PVD or CVD or wet deposition techniques such as electroplating, and electroless plating, etc. may be used to deposit the ruthenium. The planarization process can be implemented using a chemical-mechanical polish (CMP) process with a suitable etch slurry. It is also noted that a thin metal liner 108 or combination of multiple metal liners, such as tantalum nitride (TaN), etc. can be deposited first as a barrier or an adhesion layer followed by bulk metal deposition of the ruthenium layer. The thickness or height of the metallic layer 106 of ruthenium may range between about 60 nm to about 80 nm, or be about 70 nm. The thin metal liner 108 may have a thickness or height of about 2 nm.

Thereafter, a cap layer 110 is deposited on the metallic layer 106. The cap layer 110 serves to inhibit the diffusion of the metallic layer 106, e.g., ruthenium, during processing and is typically fabricated from a nitride such as silicon carbon nitride (SiCN), silicon nitride (SiN), or the like. The cap layer 110 can have a thickness ranging from about 40 nm to about 60 nm or be about 50 nm. The cap layer 110 may be deposited on the metallic layer 106 using any known techniques including, for example, one or more of a plasma enhanced atomic layer deposition (PEALD) process and/or the aforementioned PECVD, PVD, CVD, ALD processes, etc.

Thereafter, a first lithographic stack is deposited onto the semiconductor structure 100, specifically, the cap layer 110. The first lithographic stack includes a sacrificial organic planarization layer (OPL) 112, which, in some embodiments is formed to a thickness ranging from about 90 nm to 110 nm, or about 100 nm. The OPL 112 may be deposited from solution, e.g., by any conventional deposition process, and baked at a high temperature. The OPL 112 may be self-leveling and may achieve planarization over the surface topography without the use of etching, chemical mechanical polishing, or other conventional planarization techniques. The OPL 112 can include an organic polymer made up of a light-sensitive material that, when exposed to electromagnetic (EM) radiation, is chemically altered and thus configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB).

The first lithographic stack further includes a hardmask film 114 disposed on the OPL 112. The hardmask film 114 may include silicon oxynitride (SiON) or any other suitable hardmask material. The thickness of the hardmask film 114 may range between about 20 nm to about 30 nm, or be about 25 nm. The material of the hardmask film 114 possesses a high etch resistance to the reactive ion etching (RIE) processes utilized for etching the OPL 112. The hardmask film 114 can be formed by spin coating, spray coating, dip coating, PECVD or sputtering. The first lithographic stack further includes a photoresist 116 deposited over the hardmask film 114 (with an optional antireflective layer deposited between the hardmask and the photoresist). The photoresist 116 can be a layer of a photoresist sensitive to deep-ultraviolet (DUV) radiation, extreme ultraviolet (EUV), or mid-ultraviolet (MUV) radiation as known in the art, or can be an e-beam resist that is sensitive to radiation of energetic electrons. As such, the photoresist includes any conventional organic photoresist material, such as, for example, methacrylates and polyesters. The photoresist 116 can be formed utilizing any conventional deposition process including, but not limited to, CVD, PECVD, evaporation, spin coating and dip coating. The photoresist 116 can have a thickness from 30 nm to 500 nm, with a thickness from 100 nm to 200 nm being more typical.

FIG. 2 is a top plan view illustrating the semiconductor structure 100 at the first intermediate stage of fabrication. The photoresist 116 is shown on the hardmask film 114. The photoresist 116 is patterned as desired, for example, by exposing the photoresist to radiation (e.g., ultraviolet radiation, electron beam, x-ray, ion beams, etc.) through a lithographic photomask, and then applying an aqueous developer solution to the exposed photoresist to pattern the photoresist. In one illustrative embodiment, the patterned photoresist defines a linear configuration (e.g., masked region) with the areas surrounding the photoresist open or removed (e.g., unmasked when exposed to light) in a positive photoresist arrangement. In one illustrative embodiment, a bottom anti-reflectant coating (BARC) (incorporated as part of the photoresist 116 in the drawing figurers for ease of illustration) may be utilized to reduce reflection of light from a layer to be etched during exposure of a photoresist 116 formed over the BARC. The BARC layer may comprise an organic or inorganic anti-reflection coating. In one illustrative embodiment, the BARC layer comprises a silicon BARC (Si-BARC) layer. In an illustrative embodiment, the photoresist pattern is formed by depositing (e.g., spin coating) a layer of photoresist material over the BARC layer, and then exposing and developing the layer of photoresist material to form the photoresist pattern. The photoresist defines a pattern which will generally correspond to a first metallic line to be incorporated within the interconnect structure.

Figure 3:
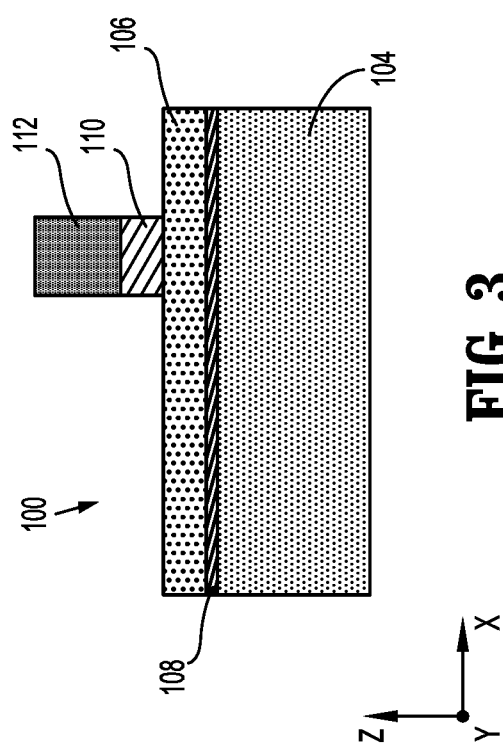
FIG. 3 is a schematic cross-sectional view along the x-axis of the semiconductor structure at a second intermediate stage of fabrication according to one or more illustrative embodiments.

With reference to FIG. 3, after the photoresist 116 is developed and patterned, a conventional etching process, e.g., reactive ion etching (RIE) (with, e.g., a halogen-based plasma chemistry) is utilized in a second intermediate stage of fabrication to remove the hardmask film 114, the OPL 112 and the cap layer 110 (with the exception of the unexposed segment beneath and protected by the photoresist 116) up to the metallic layer 106. It is noted that in FIG. 3, and all subsequent figures, the semiconductor substrate 102 is not depicted for ease of illustration.

Figure 4:
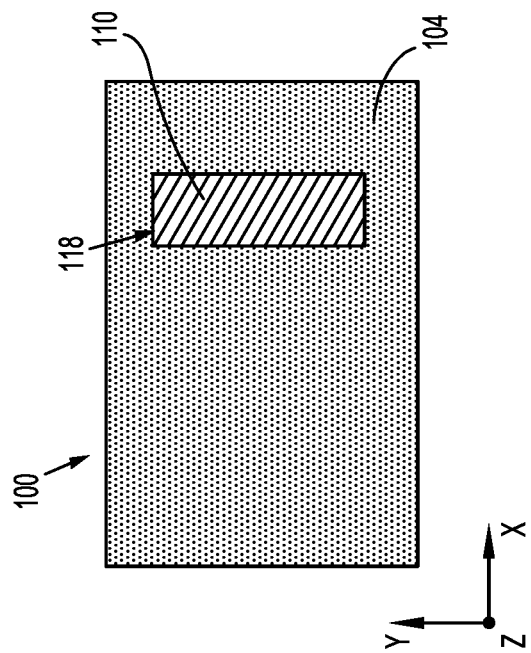
FIG. 4 is a schematic cross-sectional view along the x-axis of the semiconductor structure at a third intermediate stage of fabrication according to one or more illustrative embodiments.
Figure 5:
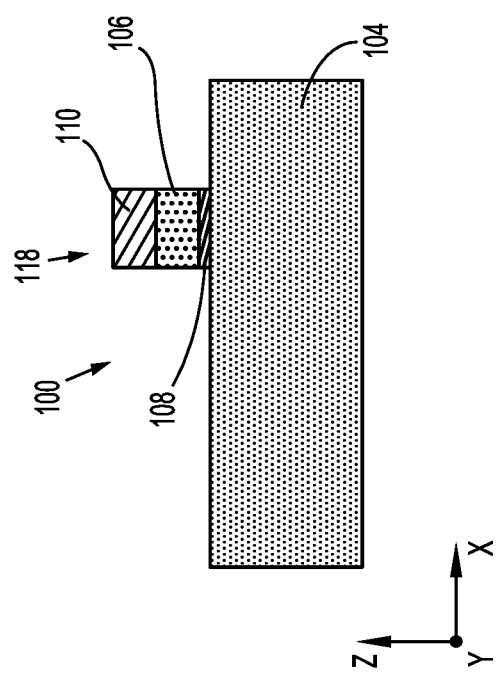
FIG. 5 is a schematic top plan view of the semiconductor structure at the third intermediate stage of fabrication according to one or more illustrative embodiments.

With reference to FIGS. 4-5, through a subtractive etching process including, for example, including plasma etching, the metallic layer 106 and the thin metal liner 108 are selectively etched in accordance with a third intermediate stage of fabrication leaving the unexposed segments of the cap layer 110, the metallic layer 106 and the thin metal liner 108 (i.e., originally beneath the photoresist 116) intact. Any remaining segment of the OPL 112 is also removed via, for example, an ashing process or the like. The etching material can be an oxygen ash or a nitrogen or hydrogen-based chemistry including, e.g., nitrogen gas or hydrogen gas, or a combination thereof. The ash etching process removes the organic planarization layer OPL 112 with little or no gouging of the remaining components.

Thus, the subtractive etching process creates a first metallic line (e.g., including at least of the remaining metallic layer 106 of ruthenium and the thin metal liner 108) of the interconnect structure. The first metallic line is generally designated as reference numeral 118. FIG. 5 is a top plan view illustrating the first metallic line 118 incorporating the remaining cap layer 110, metallic layer 106 and the thin metal liner 108 on the interlayer dielectric substrate 104 of the semiconductor structure 100.

Figure 7:
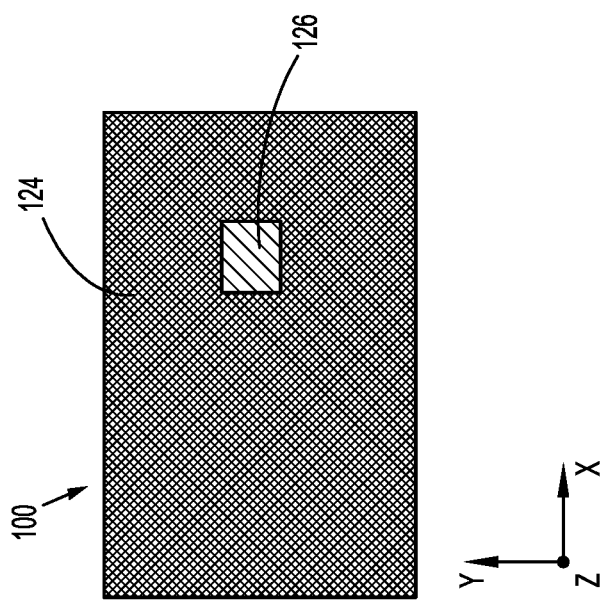
FIG. 7 is a schematic top plan view of the semiconductor structure at the fourth intermediate stage of fabrication according to one or more illustrative embodiments.
Figure 6:
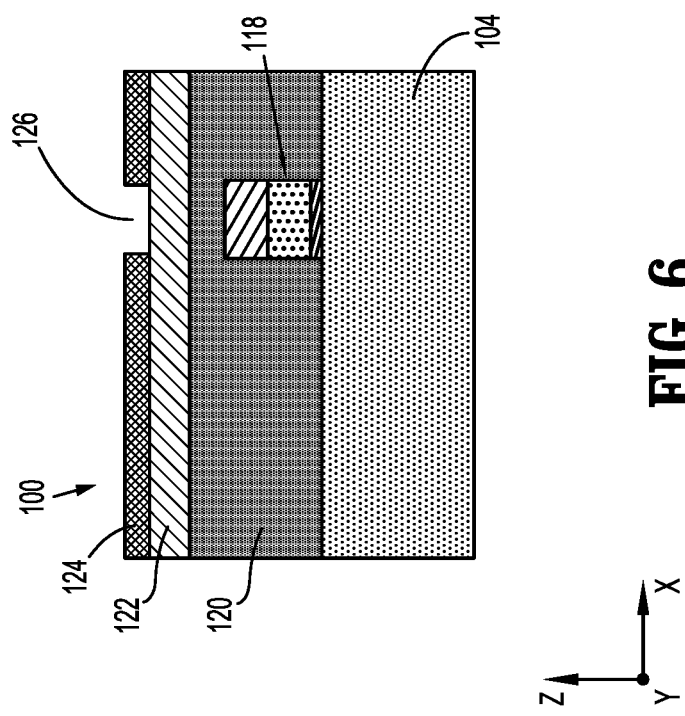
FIG. 6 is a schematic cross-sectional view along the x-axis of the semiconductor structure at a fourth intermediate stage of fabrication according to one or more illustrative embodiments.

With reference to FIGS. 6-7, a fourth intermediate stage in the fabrication process includes depositing a second lithographic stack onto the interlayer dielectric substrate 104. The second lithographic stack includes a layer of OPL 120, a hardmask film 122 of SiON or any other suitable material and a photoresist 124. The OPL 120, hardmask film 122 and the photoresist 124 may contain materials and dimensions similar to their corresponding counterparts of the first lithographic stack described hereinabove. The photoresist 124 is patterned to define a patterned window 126 which is vertically above the underlying first metallic line 118 of the remaining metallic layer 106 created in the preceding stage of fabrication. The patterned window 126 in the photoresist 124 will correspond to an open or cut to be created in the first metallic line 118.

Figure 8:
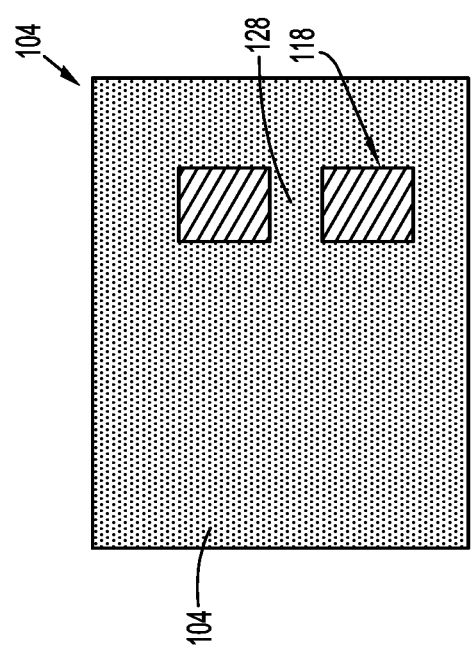
FIG. 8 is a schematic top plan view of the semiconductor structure at a fifth intermediate stage of fabrication according to one or more illustrative embodiments.

In a next or fifth intermediate stage of fabrication depicted in FIG. 8, any one or more of the aforementioned etching processes is employed to etch, through the patterned window 126 in the photoresist 124, the underlying segment layers of the remaining hardmask film 122 and the OPL 120. The one or more etching processes also penetrate underlying segments of the first metallic line 118 including the cap layer 110, the metallic layer 106 and the thin metal liner 108 in alignment with the window 126. Upon completion of this stage of fabrication, an opening 128 in the first metallic line 118 is created extending to the interlayer dielectric substrate 104 as best depicted in the top plan view of FIG. 8. The remaining OPL 120 and hardmask film 122 may be removed via a conventional etching process, e.g., reactive ion etching (RIE), which may occur subsequent to the formation of the opening in the metallic line.

Thus, the foregoing process describes the formation of a first metallic line 118 having a first cut or opening 128 in accordance with one illustrative method of manufacture of a semiconductor structure 100 with an interconnect structure. Patterning is achieved through a double patterning lithographic etch (LELE) process, subtractive etching and a direct cut of the metallic line of ruthenium.

The following discussion will focus on formation of a second metallic line in the interconnect structure in accordance with an illustrative embodiment incorporating a "bottom-up" formation of the metallic fill.

Figure 10:
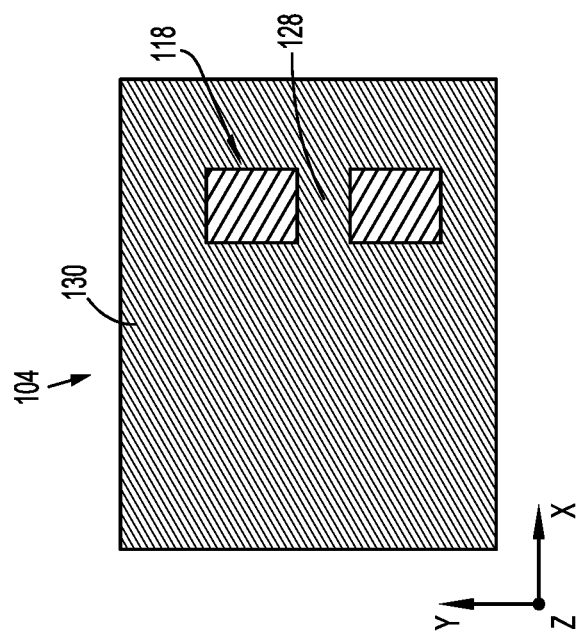
FIG. 10 is a schematic top plan view of the semiconductor structure at the sixth intermediate stage of fabrication according to one or more illustrative embodiments.
Figure 9:
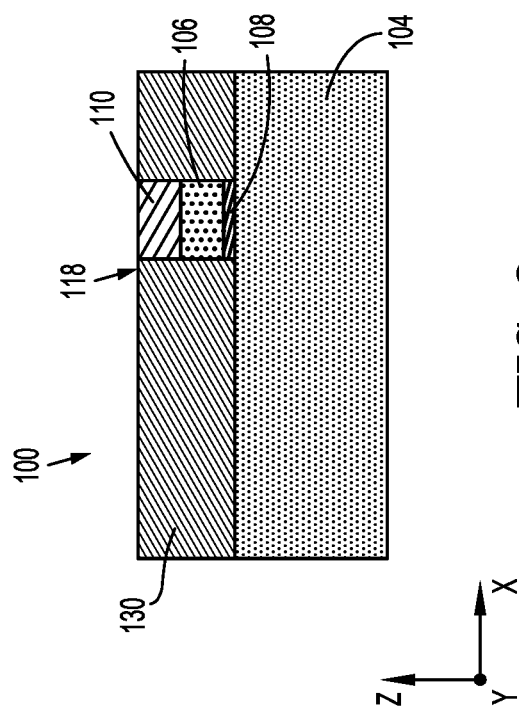
FIG. 9 is a schematic cross-sectional view along the x-axis of the semiconductor structure at a sixth intermediate stage of fabrication according to one or more illustrative embodiments.

With reference to FIGS. 9-10, in accordance with a sixth intermediate stage of fabrication, an ultra "low k" insulating/dielectric layer 130 is deposited on the interlayer dielectric substrate 104 and encompasses the first metallic line 118 including the remaining cap layer 110 and thin metal liner 108. The "low k" dielectric layer may include silicon oxide (e.g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), SiOC films or SiOCH low-k films and other similar types of insulating/dielectric materials or porous dielectrics which are non-reactive with the metallic material that is used to form the second metallic line of the interconnect structure. The "low k" dielectric layer may be formed using known deposition techniques, such as, for example, ALD (atomic layer deposition), CVD (chemical vapor deposition), PECVD (plasma-enhanced CVD), or PVD (physical vapor deposition), or spin-on deposition. The dielectric layer 130, in an illustrative embodiment, is designed to minimize capacitive coupling, and has a dielectric constant of 3.0 or less. In one embodiment, the dielectric layer 130 is formed with a thickness in a range of about 20 nm to about 800 nm.

Figure 12:
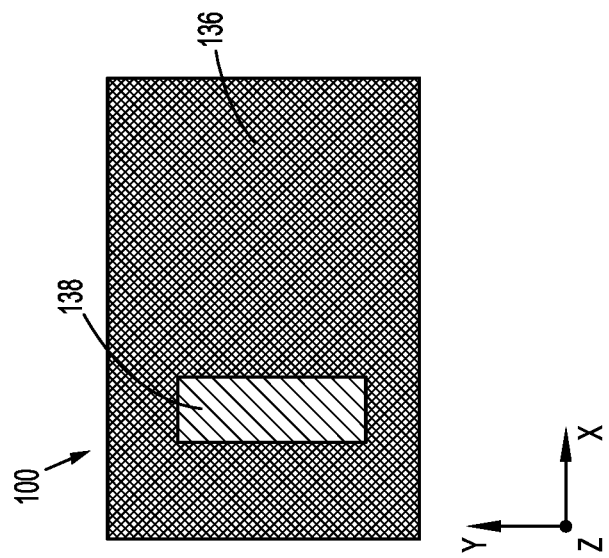
FIG. 12 is a schematic top plan view of the semiconductor structure at the seventh intermediate stage of fabrication according to one or more illustrative embodiments.
Figure 11:
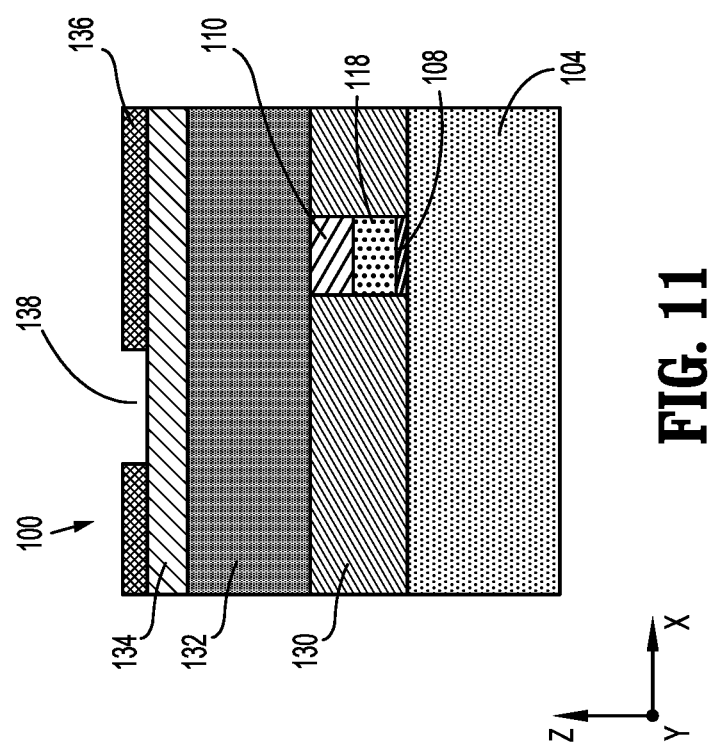
FIG. 11 is a schematic cross-sectional view along the x-axis of the semiconductor structure at a seventh intermediate stage of fabrication according to one or more illustrative embodiments.

With reference to FIGS. 11-12, in accordance with a seventh intermediate stage of fabrication, a third lithographic stack inclusive of a layer of OPL 132, a hardmask film 134 and a photoresist 136 is deposited on the dielectric layer 130. The photoresist 136 is patterned or developed to define a window 138 which is longitudinally spaced along the x-axis relative to the first metallic line 118. The patterned window 138 in the photoresist 136 will correspond to the location of the second metallic line to be incorporated in the underlying interconnect structure. In illustrative embodiments, the patterned window 138 will be in general parallel relation with the first metallic line 118.

Figure 13:
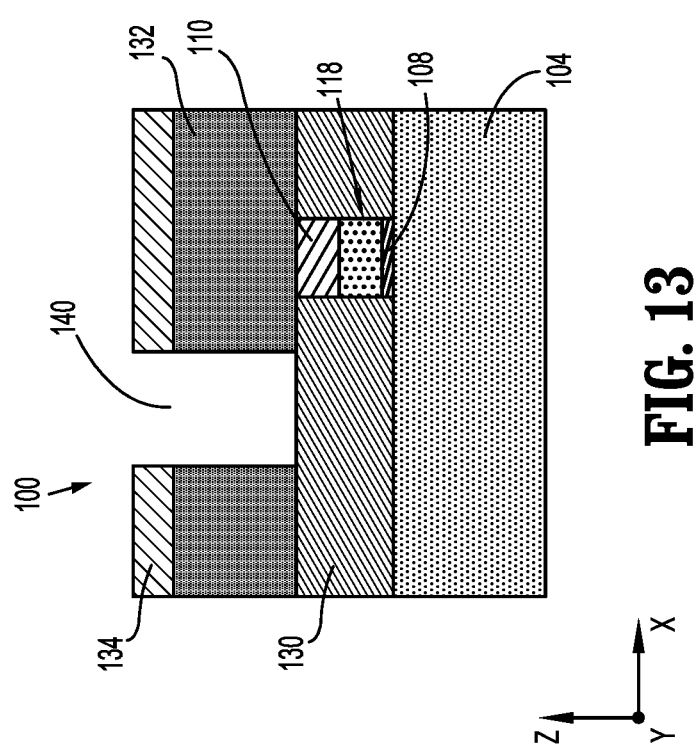
FIG. 13 is a schematic cross-sectional view along the x-axis of the semiconductor structure at an eighth intermediate stage of fabrication according to one or more illustrative embodiments.

Referring now to FIG. 13, a next or eighth intermediate stage in the process is to etch away, through the patterned window 138, the underlying hardmask film 134 and the layer of OPL 132. The etching process is selective to the dielectric layer 130. The etching process forms a cavity 140 in the hardmask film 134 and the OPL 132 which will be a template or pattern for the subsequent second metallic line.

Figure 15:
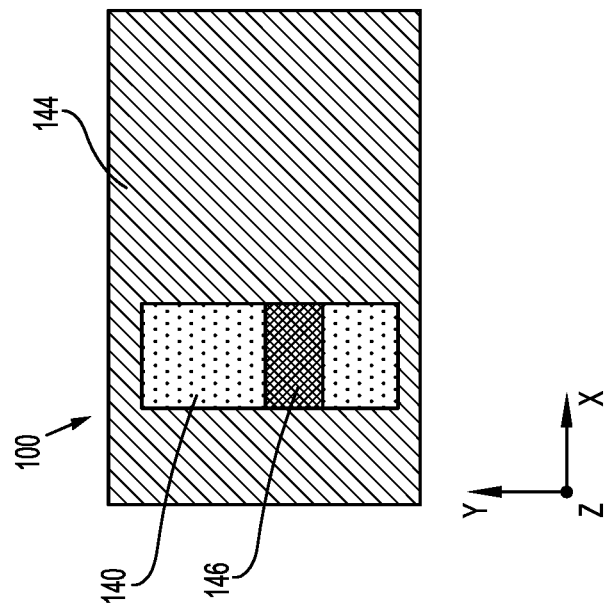
FIG. 15 is a schematic top plan view of the semiconductor structure at the ninth intermediate stage of fabrication according to one or more illustrative embodiments.
Figure 14:
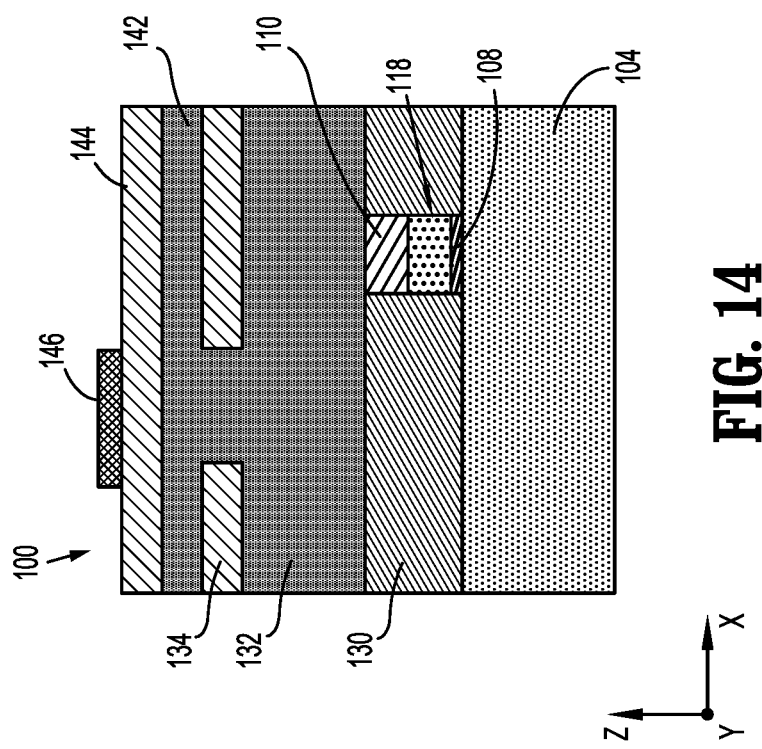
FIG. 14 is a schematic cross-sectional view along the x-axis of the semiconductor structure at a ninth intermediate stage of fabrication according to one or more illustrative embodiments.

Referring now to FIGS. 14-15, the process is continued at a ninth intermediate stage of fabrication by deposition of a fourth lithographic stack onto the semiconductor structure 100, specifically, onto the hardmask film 134 of the previously applied underlying third lithographic stack. The fourth lithographic stack includes a layer of OPL 142 applied onto the hardmask film 134, a hardmask film 144 on top of the OPL 142 and a photoresist 146. The OPL 142 also fills the cavity 140 previously formed in the OPL 132 of the third lithographic stack in connection with FIG. 13. The photoresist 146 is aligned with the previously formed cavity 140 (now filled with the OPL 142 of the fourth lithographic stack), and will be utilized to form the cut or spacing in the second metallic line of the BEOL interconnect structure.

Figure 17:
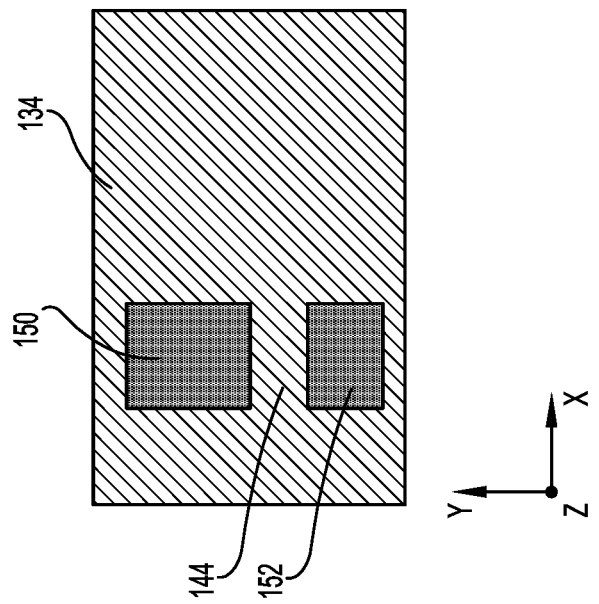
FIG. 17 is a schematic top plan view of the semiconductor structure at the tenth intermediate stage of fabrication according to one or more illustrative embodiments.
Figure 16:
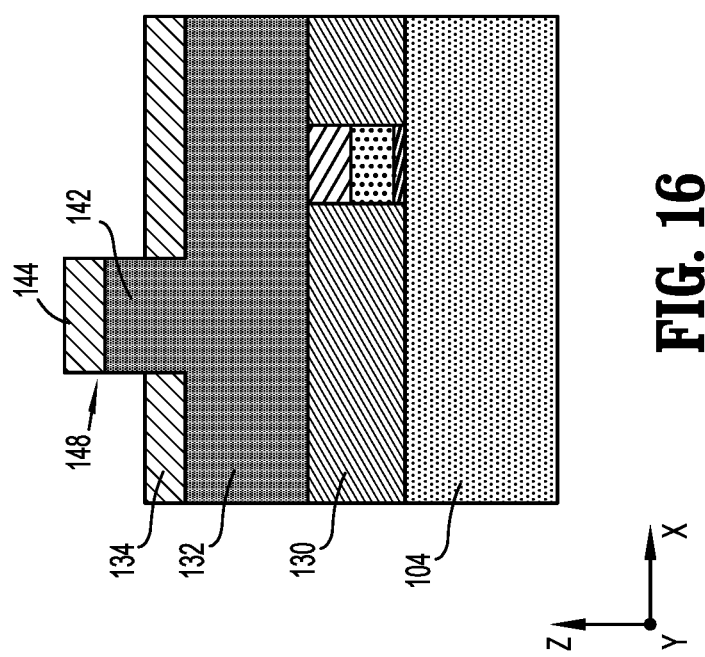
FIG. 16 is a schematic cross-sectional view along the x-axis of the semiconductor structure at a tenth intermediate stage of fabrication according to one or more illustrative embodiments.

As best depicted in FIGS. 16-17, in a tenth intermediate stage of fabrication, the hardmask film 144 and the OPL 142 of the four lithographic stack are removed via a conventional etching process leaving a pillar 148 of the fourth lithographic stack extending from the third hardmask film 134 of the third lithographic stack. The pillar 148 is a result of the presence of the photoresist 146. In addition, during the etching process, openings 150, 152 are etched on opposed sides of the pillar 148 in alignment with the cavity 140 as defined by the patterned hardmask film 134. The openings 150, 152 may terminate at, or slightly extend beyond, the hardmask film 134. In other illustrative embodiments, the openings 150, 152 may extend within the OPL 132 of the third lithographic stack and terminate at the dielectric layer 130 or, alternatively, terminate within the OPL 132 of the third stack.

Figure 18:
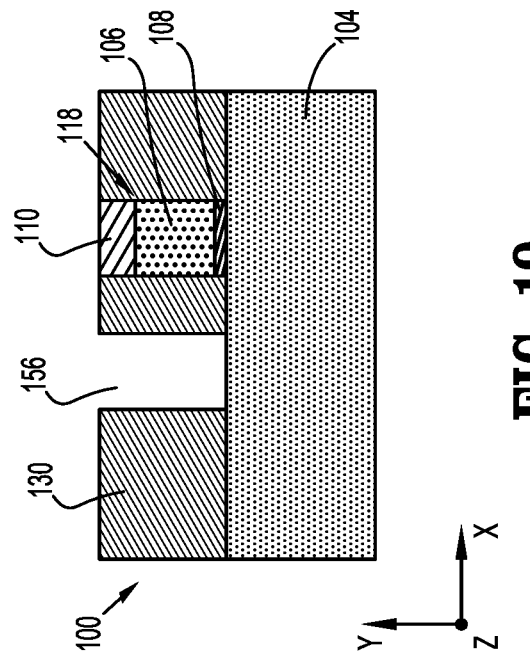
FIG. 18 is a schematic cross-sectional view of the semiconductor structure at an eleventh intermediate stage of fabrication according to one or more illustrative embodiments.
Figure 19:
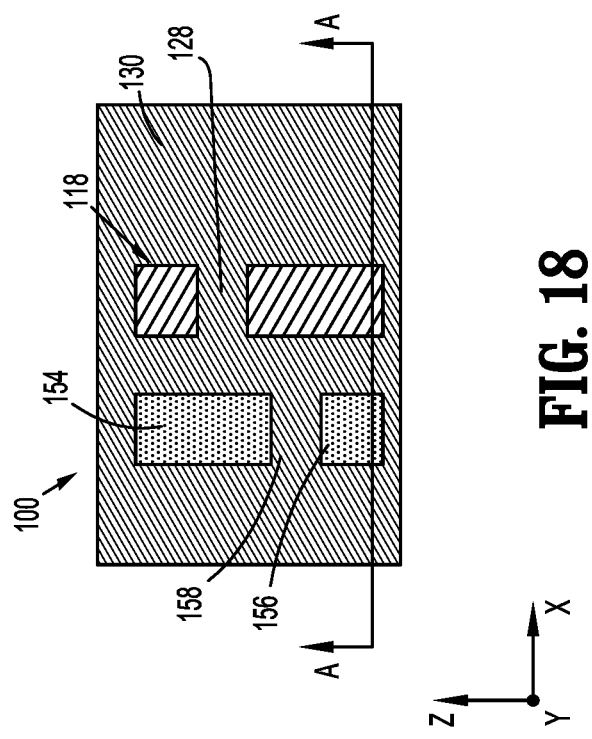
FIG. 19 is a schematic cross-sectional view of the semiconductor structure taken along the lines A-A of FIG. 18 at the eleventh intermediate stage of fabrication according to one or more illustrative embodiments.

Thereafter, with reference to FIGS. 18-19, in an eleventh intermediate stage of fabrication, the OPL 132 beneath the openings 150, 152 is etched via an etching process selective to the underlying ULK material of the dielectric layer 130 whereby the openings 150, 152 extend to the dielectric layer 130. Thereafter, through a suitable etching process, the dielectric layer 130 beneath the openings 150, 152 is etched away to form respective opposed trenches 154, 156 in the dielectric layer 130 separated by the pillar 148 and a segment 158 of ULK material underlying the pillar 148. In FIGS. 18-19, the pillar 148 is shown already removed, which may occur during the etching processes utilized during forming of the trenches 154, 156. The trenches 154, 156 will be eventually filled with metallic material to form the second metallic line in the interconnect structure. The segment 158 of ULK material previously beneath the pillar 148 and separating the trenches 154, 156 remains, and will form a cut or opening in the second metallic line. If any residual material remains after etching of the trenches 154, 156, the remaining OPL layers 132, 142 and hardmask films 134, 144, inclusive of the pillar 148, may be removed via an ashing process or any of the aforementioned etching processes.

Thus, subsequent to this stage of fabrication, two aligned trench openings 154, 156 are formed in the dielectric layer 130 and separated by a segment 158 of "low k" dielectric material (i.e., previously disposed beneath the pillar 148) which forms the cut in the second metallic line to be formed in the interconnect structure.

Figure 20:
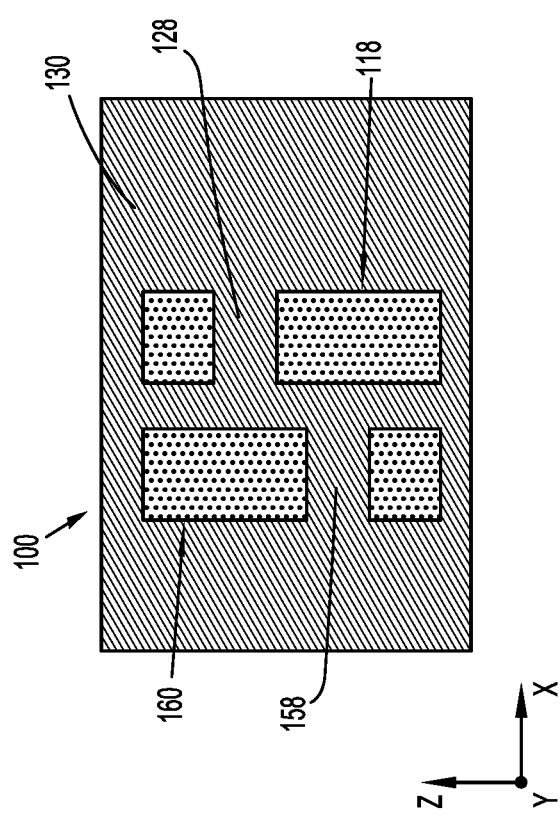
FIG. 20 is a schematic cross-sectional view of the semiconductor structure at a twelfth intermediate stage of fabrication according to one or more illustrative embodiments.

Referring now to FIG. 20, the trenches 154, 156 are filled with a metallic material to form the second metallic line 160 in the interconnect structure in accordance with a twelfth intermediate stage of fabrication. In one exemplative embodiment, a selective liner of ruthenium and cobalt is grown in the trenches followed by deposition of a volume or layer of ruthenium utilizing known dry deposition techniques such as ALD, PVD or CVD or wet deposition techniques such as electroplating, and electroless plating, etc. A planarization process can be implemented using, for example, a chemical-mechanical polish (CMP) process with a suitable etch slurry to planarize any overburden of the ruthenium material.

In another illustrative embodiment, a liner comprising tantalum (Ta) and cobalt (Co) may be deposited in the trenches followed by deposition of copper via any of the aforementioned deposition and planarization processes. In yet another illustrative embodiment, no liner is utilized and ruthenium (RU) material is deposited directly within the trenches via any of the aforementioned deposition processes.

Thus, in accordance with illustrative embodiments, at least two metallic lines 118, 160 are formed within a BEOL interconnect structure through a subtractive etching of the first metallic line 118 and a bottom up formation of the second metallic line 160. More than two metallic lines formed via any of the methodologies is envisioned. The illustrated methodology bypasses the segment removal schemes needed in conventional (SAMP), self-aligned double patterning (SADP), self-aligned quadruple patterning (SAQP) and self-aligned triple patterning (SATP) schemes. The direct cut integration implemented on the metal lines addresses critical dimension issues by providing a minimum tip2tip (T2T) critical dimension (CD) of 16 nm to 20 nm which is very significant in device performance. The direct cut is achieved through a subtractive etching process on the first metallic line of ruthenium (Ru) which enhances integration and improves advanced via integration concepts. The direct cut on the second metallic line may be via a damascene process thereby providing an opposite profile to the first cut. Other features include reduced patterning processes, etching processes, etc.

It is envisioned that the semiconductor structure of FIGS. 1-20 may be a part of a semiconductor and also a component of an integrated circuit. The resulting integrated circuit incorporating the semiconductor components can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The end product can be any product that includes integrated circuits, ranging from toys and other low-end applications to advanced computer products having a display, a keyboard or other input device, and a central processor.

It is to be understood that the embodiments discussed herein are not limited to the particular materials, features, and processing steps shown and described herein. In particular, with respect to the processing steps, it is to be emphasized that the descriptions provided herein are not intended to encompass all of the processing steps that may be required to form a functional semiconductor integrated circuit device.

The descriptions of the various illustrative embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   applying a first metallic layer comprising a first metallic material onto a substrate of a semiconductor component;
   forming a first photomask on the first metallic layer;
   removing portions of the first photomask in accordance with a first patterned photoresist to remove portions of the first metallic layer to form a first metallic line;
   depositing a dielectric material on the substrate;
   forming at least one trench in the dielectric material; and
   depositing a second metallic material within the at least one trench to form a second metallic line;
   wherein at least the first and second metallic lines and the dielectric form an interconnect structure of the semiconductor component;
   wherein forming a first photomask comprises disposing a first lithographic stack on the first metallic layer, the first lithographic stack including the first patterned photoresist, a hardmask liner below the first patterned photoresist and a first sacrificial material beneath the hardmask liner; and
   wherein removing portions of the first metallic layer comprises etching the hardmask liner and the first sacrificial material in accordance with the first patterned photoresist to form the first metallic line.

2. The method of claim 1, including forming a cap layer on the first metallic layer and wherein etching the hardmask liner includes etching the cap layer in accordance with the first patterned photoresist.

3. The method of claim 1, including creating an opening in the first metallic line.

4. The method of claim 3, wherein creating an opening in the first metallic line includes:
   depositing a second lithographic stack on the substrate of the semiconductor component to encompass the first metallic line, the second lithographic stack including a second patterned photoresist defing a window, a second hardmask liner below the second patterned photoresist and a second sacrificial material beneath the second hardmask liner; and
   etching the second hardmask liner, the second sacrificial material and the first metallic line through the window of the second patterned photoresist to form the opening in the first metallic liner.

5. The method of claim 4, wherein depositing the dielectric material includes filling the opening in the first metallic line with a first segment of the dielectric material.

6. The method of claim 5, wherein forming the at least one trench includes creating first and second aligned trench openings separated by a second segment of the dielectric material and wherein depositing the second metallic material forms the second metallic line having an opening.

7. The method of claim 6, wherein forming the trench includes:
   depositing a third lithographic stack on the dielectric material, the third lithographic stack including a third patterned photoresist, a third hardmask liner below the third patterned photoresist and a third sacrificial material beneath the third hardmask liner; and
   etching the third hardmask liner and the third sacrificial material in accordance with the third patterned photoresist to form a cavity at least in the third hardmask liner and the third sacrificial material, the cavity corresponding to the location of the trench.

8. The method of claim 7, including depositing a fourth lithographic stack on the third lithographic stack, the fourth lithographic stack including a fourth patterned photoresist, a fourth hardmask liner below the fourth patterned photoresist and a fourth sacrificial material beneath the fourth hardmask liner; and
   etching the fourth hardmask liner and the fourth sacrificial material in accordance with the fourth patterned photoresist to form a pillar extending from the third hardmask liner of the third lithographic stack.

9. The method of claim 8, including etching through the cavity defined by the third hardmask liner to define openings extending to the dielectric material.

10. The method of claim 9, including etching the dielectric material through the openings to form opposed trenches in the dielectric material separated by a segment of dielectric material.

11. The method of claim 10, wherein depositing the fourth lithographic stack includes at least partially filling the cavity with the fourth sacrificial material, and wherein etching through the cavity includes etching away the fourth sacrificial material disposed therein.

12. The method of claim 10, wherein depositing the second metallic material includes at least partially filling the opposed trenches to form the second metallic line having an opening filled with a second segment of the dielectric material.

13. The method of claim 12, wherein the second metallic material includes at least one of ruthenium and copper.

14. The method of claim 1, wherein the first metallic material includes ruthenium.

15. A method, comprising:
   depositing one lithographic stack onto a dielectric material of a semiconductor substrate, the one lithographic stack including a patterned photoresist, a hardmask liner below the patterned photoresist and a sacrificial material beneath the hardmask liner;
   etching the hardmask liner and the sacrificial material in accordance with the patterned photoresist to form a cavity at least in the hardmask liner and the sacrificial material, the cavity, extending to the dielectric material;
   depositing an additional lithographic stack on the one lithographic stack, the additional lithographic stack including a patterned photoresist, a hardmask liner below the patterned photoresist and a sacrificial material beneath the hardmask liner wherein the sacrificial material of the additional lithographic stack at least partially fills the cavity;

etching the additional lithographic stack in accordance with the patterned photoresist of the additional lithographic stack to define a pillar extending from the one lithographic stack in alignment with the cavity;

removing portions of the sacrificial material of at least the additional lithographic stack within the cavity and around the pillar to define openings extending to the dielectric material;

forming trenches in the dielectric material; and depositing a metallic material within the trenches to form a second metallic line in the dielectric material;

wherein the metallic line includes an opening filled with a segment of dielectric material underlying the pillar.

16. The method of claim 15, including disposing an additional metallic line in the dielectric layer of the semiconductor substrate.

17. The method of claim 15, wherein forming trenches in the dielectric material includes etching the dielectric material.

18. The method of claim 17, wherein removing portions of the sacrificial material includes etching through the cavity defined within the hardmask liner of the one lithographic stack.

19. A method, comprising:

forming a first metallic line on a substrate of a semiconductor component;

removing a segment of the first metallic line to define an opening therein;

depositing a dielectric material on the substrate, the dielectric material filling the opening within the first metallic line;

patterning, with a lithographic process, an image of a cavity on the dielectric material;

disposing at least one lithographic stack relative to the substrate;

etching the at least one lithographic stack to form a lithographic pillar in alignment with the cavity;

removing dielectric material on each side of the lithographic pillar in accordance with the image of the cavity to form two aligned trenches in the dielectric material;

removing the lithographic pillar; and depositing a second metallic material within the two aligned trenches to form a second metallic line having an opening filled with the dielectric material.

20. The method of claim 19, wherein the first metallic material includes ruthenium and wherein the second metallic material includes at least one of ruthenium and copper.

* * * * *